(12) United States Patent
Gaylord, III et al.

(10) Patent No.: US 6,355,111 B1
(45) Date of Patent: Mar. 12, 2002

(54) METHOD FOR REMOVING CONTAMINANTS FROM A WORKPIECE USING A CHEMICALLY REACTIVE ADDITIVE

(75) Inventors: Richard Hilliard Gaylord, III, Essex Junction; Frederick William Kern, Jr., Colchester; Donald Joseph Martin, Fairfield, all of VT (US); Harald Franz Okorn-Schmidt, Putnam Valley, NY (US); John Joseph Snyder; William Alfred Syverson, both of Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/449,087

(22) Filed: Nov. 24, 1999

(51) Int. Cl.$^7$ .............................. B08B 3/08; B08B 5/00; C23G 1/02
(52) U.S. Cl. .................................. 134/3; 134/2; 134/21; 134/25.4; 134/26; 134/30; 134/902
(58) Field of Search ............................... 134/2, 3, 25.4, 134/26, 21, 30, 902

(56) References Cited

U.S. PATENT DOCUMENTS

| | | | |
|---|---|---|---|
| 4,984,597 A | 1/1991 | McConnell et al. | |
| 5,271,774 A | 12/1993 | Leenaars et al. | |
| 5,571,337 A | 11/1996 | Mohindra et al. | |
| 5,772,784 A | * 6/1998 | Mohindra et al. | ............ 134/21 |
| 5,911,837 A | 6/1999 | Matthews | |

FOREIGN PATENT DOCUMENTS

EP            0 385 536 A1        2/1990

* cited by examiner

*Primary Examiner*—Zeinab El-Arini
(74) *Attorney, Agent, or Firm*—Schmeiser, Olsen & Watts; William D. Sabo

(57) ABSTRACT

A method for drying one or more workpieces. The method includes the use of a chemically reactive additive to remove contaminants from the wafer surface during processing. In particular, during processing, a wafer is rinsed in a liquid bath and subsequently exposed to a chemically reactive additive. The chemically reactive additive creates a surface tension gradient that physically and chemically alters the properties of the film of the rise liquid so that the liquid and any contaminants contained therein are removed from the wafer surface.

26 Claims, 5 Drawing Sheets

METHOD FOR REMOVING CONTAMINANTS FROM A WORKPIECE USING A CHEMICALLY REACTIVE ADDITIVE

BACKGROUND OF THE INVENTION

1. Technical Field

The present invention generally relates to a method and apparatus for removing contaminants from a workpiece, such as a semiconductor. In particular, the present invention relates to an apparatus and method for removing contaminants from a workpiece using chemically reactive additive to promote the effectiveness of surface tension gradient drying.

2. Description of Relevant Art

A variety of methods have been attempted to achieve drying of wafers. One common method utilizes a centrifugal dryer, which unfortunately places mechanical stresses that may result in breakage of the wafer. Also, since it is difficult to avoid evaporation of water on the wafer surface during spinning by the centrifugal dryer, dissolved silicates or suspended solids may precipitate onto the surface of the workpiece, leading to device failure.

Chemical vapor drying or chemical solvent drying have the disadvantages that the chemical often forces dissolved or suspended solids such as silicates or colloidal silica to precipitate onto the surface of the workpiece, leading to device failure. A second disadvantage is that chemical vapors and solvents do not completely remove moisture and chemical/particulate impurities or contaminants. A third disadvantage is that chemical vapors and solvents have not been chosen to control acidity and basicity to dissolve minerals such as silicate to avoid precipitation on the workpiece during drying. A fourth disadvantage is that chemical vapors and solvents do not create a buffer to maintain a constant pH to effect particle removal by taking advantage of the relationship between particle zeta potential and pH. Thus a need exists to more adequately remove contaminants from a workpiece and improve drying methods for various workpieces.

Matthews, 1999, in U.S. Pat. No. 5,911,837, Mohindra et al., 1996, in U.S. Pat. No. 5,571,337, McConnell et al., 1991, in U.S. Pat. No. 4,984,597, Leenaars et al., 1993, U.S. Pat. No. 5,271,774 and Leenaars, 1990, European Patent No. 0 385 536 A1 disclose examples of drying apparatuses.

SUMMARY OF THE INVENTION

According to one aspect of the present invention, a method for removing contaminants from a workpiece is provided. The method includes the following steps: (1) providing a workpiece; (2) contacting the workpiece with a liquid; and (3) removing the liquid from said workpiece using a chemically reactive additive.

According to a second aspect of the present invention, a method for removing contaminants from a workpiece is provided. The method includes the following steps: (1) providing a workpiece; (2) contacting the workpiece with a liquid; (3) withdrawing said workpiece from said liquid, such that a portion is submerged in the liquid, and a remaining portion is exposed to a chemically reactive additive; (4) developing a concentration gradient of said chemically reactive additive in said liquid film; and (5) removing the liquid film from said workpiece using said concentration gradient of said chemically reactive additive in said liquid film.

According to a third aspect of the present invention, a method for removing contaminants from a workpiece is provided. The method includes the following steps: (1) providing a liquid bath; (2) providing a workpiece submerged in said liquid bath; (3) providing a chemically reactive additive diffusion limiting barrier over said liquid bath and a chemically reactive additive over said chemically reactive additive diffusion limiting barrier; (4) extending a portion of the workpiece over said surface of the chemically reactive additive diffusion limiting barrier, wherein said portion is covered with a liquid film and wherein said portion of said liquid film includes some of said chemically reactive additive; (5) developing a concentration gradient of said chemically reactive additive in said liquid film; and (6) removing the liquid film from said workpiece using said concentration gradient of said chemically reactive additive in said liquid film.

According to a fourth aspect of the present invention, an apparatus for drying a workpiece is provided. The apparatus includes: (1) a liquid bath; (2) a workpiece, wherein a part of the workpiece is submerged in the liquid bath, and wherein a remaining part extends above the liquid bath and is surrounded by a chemically reactive additive; and (3) a liquid film on the part of the workpiece extending above the liquid bath, wherein the liquid film has a concentration gradient of the chemically reactive additive.

According to a fifth aspect of the present invention, an apparatus for drying a workpiece is provided. The apparatus includes: (1) a liquid source; (2) a rotating workpiece; and (3) a liquid film on the surface of the rotating workpiece, wherein the liquid film is exposed to a chemically reactive additive and wherein the liquid film has a concentration gradient of the chemically reactive additive.

Workpieces, such as silicon wafers, often undergo a series of wet chemical steps during processing. If removal of the residues from these chemicals is incomplete or if soluble silicates or insoluble silica that are byproducts from reaction of the chemicals with the wafer remain on the surface of the wafer, device failure may result. It is therefore an advantage of the present invention to provide an apparatus and method to remove these contaminants from a workpiece, such as a silicon wafer, without leaving contaminants on the surface of the workpiece that may result in device failure. A second advantage of the present invention is to provide an apparatus and method to remove typical contaminants such as soluble and insoluble metal oxides and hydroxides, mineral particulates, colloidal silica and silicates from a workpiece, such as a semiconductor wafer, by chemically dissolving them by exposing the workpiece to the chemically reactive additive. A third advantage of the present invention is to provide an apparatus and method to control the equilibrium between contaminants such as soluble silicates ($SiO_3^{-2}$) and insoluble silica ($SiO_2$). A fourth advantage of the present invention is an apparatus and method to remove contaminants by exposing the workpiece to the chemically reactive additive without pitting the workpiece by controlling the temperature and pH of the liquid film, the concentration of the chemically reactive additive over the liquid bath and the rate at which the wafer is exposed to the chemically reactive additive. A fifth advantage is an apparatus and method to use a mixture of acidic and basic chemically reactive additives (e.g. $NH_3$ and $HCl$) to create a buffer to maintain a constant pH to effect removal of contaminants by taking advantage of the relationship between contaminant particle zeta potential and pH.

BRIEF DESCRIPTION OF THE DRAWINGS

These and other features and advantages of this invention will be more readily understood from the following detailed description of the various aspects of the invention taken in conjunction with the accompanying drawings in which.

Figure 2:
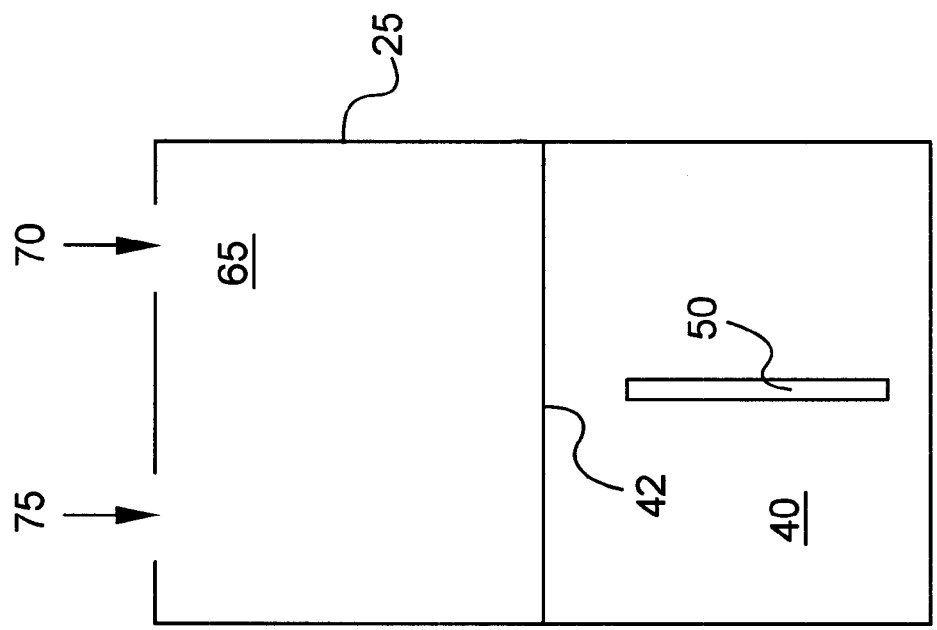
FIG. 2 depicts an apparatus for rinsing the workpiece with liquid and introducing a chemically reactive additive over the liquid, according to a preferred embodiment of the present invention.

It is noted that the drawings of the preferred embodiments of the invention are not to scale. The drawings are merely schematic representations, not intended to portray specific parameters of the invention. The drawings are intended to depict only a typical embodiment of the invention, and therefore should not be considered as limiting the scope of the invention. In the drawings, like numbering represents like elements between the drawings.

DETAILED DESCRIPTION OF THE PREFERRED EMBODIMENT

Referring to the drawings, FIGS. 1 through 4 show a preferred embodiment of an apparatus 25 and a method for removing contaminants from a workpiece 50, such as a silicon wafer. In the preferred embodiment, depicted in FIGS. 1 through 4, the apparatus is equipped with ports 70 and 75, through which the chemically reactive additive flows into and out of the apparatus. If the chemically reactive additive includes, but is not limited to ammonia, hydrogen chloride, carbon dioxide, hydrogen fluoride and combinations thereof, and is naturally a gas at a temperature and pressure chosen for operation of the apparatus, it is provided to the apparatus through one of ports 70 and 75, and it exits from the apparatus through the other of ports 70 and 75, according to the preferred embodiment of the present invention. Alternatively, if the chemically reactive additive will condense to form a liquid or solid at a temperature and pressure chosen for operation of the apparatus, it may be provided to the apparatus through one of ports 70 and 75 using a liquid spray, liquid puddle or other equivalent technique and it exits from the apparatus through the other of ports 70 and 75, according to the present invention. Alternatively, the apparatus may be a container that has only one port equipped with a valve, through which the apparatus can be pressurized with said chemically reactive additive, wherein said chemically reactive additive is naturally a gas at a temperature and pressure chosen for operation of the apparatus. The wafer is preferably silicon, although many equivalents exist.

Figure 1:
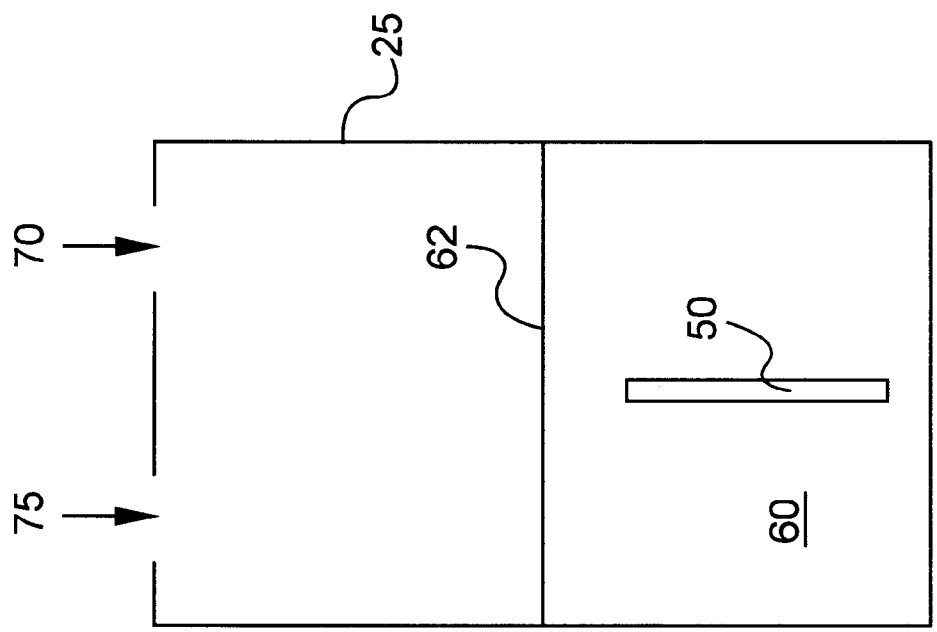
FIG. 1 depicts an apparatus for wet processing of workpieces, such as silicon wafers, that often utilizes wet chemical steps, according to a preferred embodiment of the present invention.

Workpieces, such as silicon wafers, often undergo a series of wet chemical steps during processing. If removal of these chemicals and impurities in these chemicals or their chemical by-products is incomplete or if soluble silicates or insoluble silica that are byproducts from reaction of the chemicals with the wafer remain on the surface of the wafer, device failure may result. FIG. 1 depicts a wet chemical step of submerging a wafer 50 below a surface 62 of a liquid bath 60. Hereinafter, a liquid bath 60 wherein the liquid bath is a chemical bath, includes acidic or basic liquids, organic solvents, oxidizing agents or combinations thereof, used to clean a surface of a workpiece.

As depicted in FIG. 2, a rinsing step, wherein the wafer 50 is submerged in the liquid bath 40, follows the wet chemical step depicted in FIG. 1. The liquid bath 40 is preferably deionized water, or alternatively distilled water or its equivalent. Hereinafter, fluids from rinsing, wherein the fluids contain residues from wet chemical processing, soluble silicates or soluble minerals, insoluble silica or inorganic precipitates and organic solvents, remaining on the surface of the wafer after processing will be referred to as contaminants.

Figure 3:
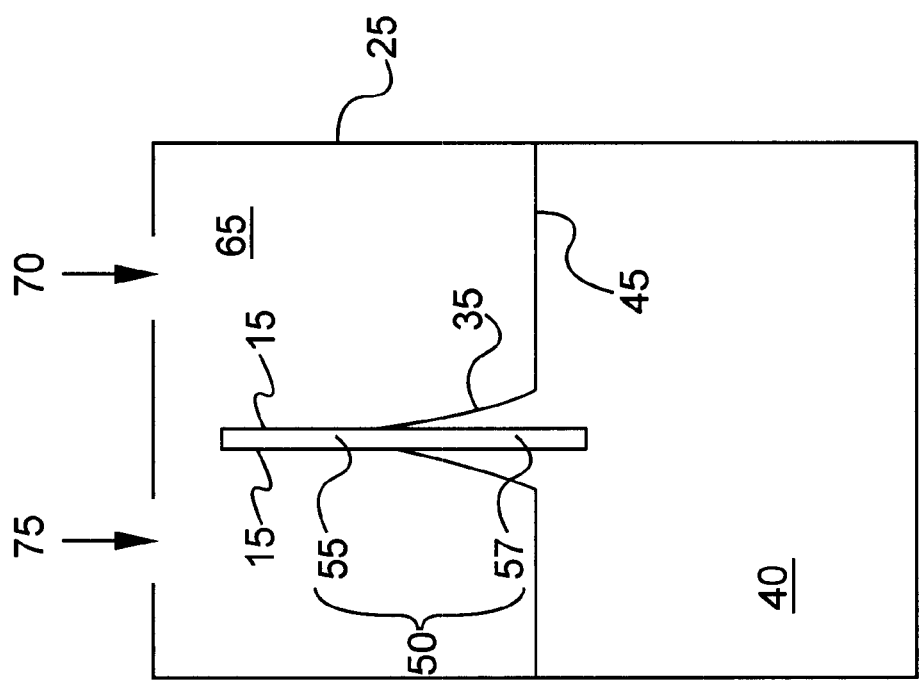
FIG. 3 depicts an apparatus for forming a surface tension gradient in the liquid film on the surface of the workpiece, according to a preferred embodiment of the present invention.

Referring to FIG. 3, removal of the contaminants from the wafer includes withdrawing the wafer, or alternatively lowering of the liquid bath 40, away from the wafer, resulting in extending a portion of the workpiece 55 through a surface 45 of the liquid bath 40, wherein the portion 55 is covered with a liquid film 35 and wherein the liquid film is exposed to a chemically reactive additive 65. Hereinafter, a liquid film is a layer of liquid on a surface of a workpiece, wherein the layer of liquid is formed on the surface of the workpiece by withdrawing it from a liquid bath. Introducing a chemically reactive additive either as a static atmosphere or as a flow over the surface 45 of the liquid bath 40 in FIG. 2 provides a chemically reactive additive 65 in apparatus 25. In the preferred embodiment, ammonia is the chemically reactive additive 65 and deionized water is the liquid bath 40. However, the chemically reactive additive may be one of, but not limited to hydrogen chloride, hydrogen fluoride, carbon dioxide, ammonia, and combinations thereof. Alternatively, the chemically reactive additive may be strongly acidic carboxylic acids such as mono-, di-, or trifluoroacetic acid, mono-, di-, or trichloroacetic acid and sulfonic acids. Alternatively, the liquid bath may be distilled water wherein distilled water is preferred over deionized water because distillation removes organic and ionic impurities in the water. In contrast, purification by deionization only removes ionic impurities. Distilled organic solvents are another alternative liquid bath for removing organic contaminants on the surface of the wafer.

Figure 4:
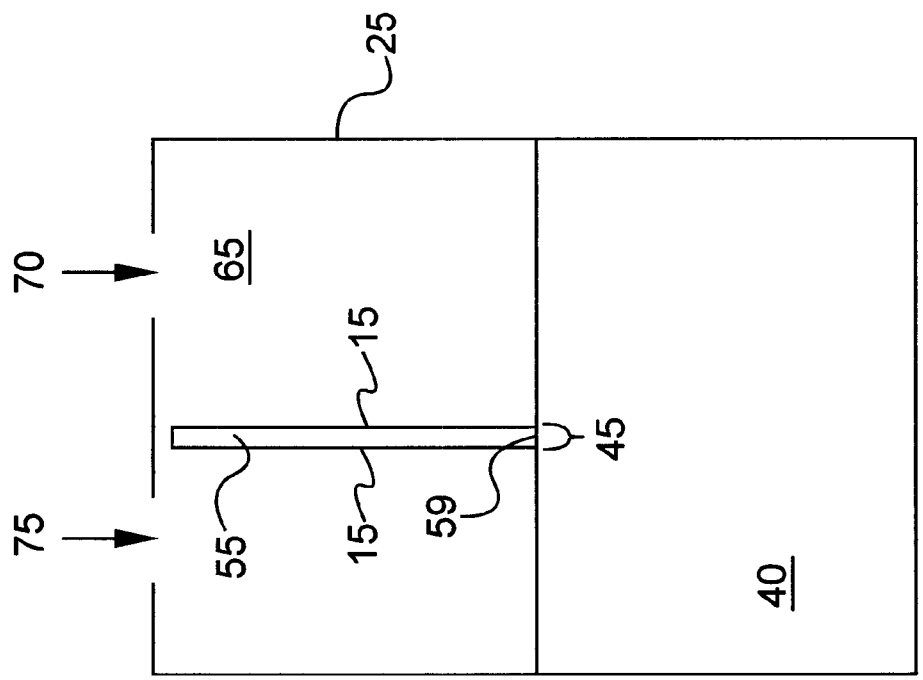
FIG. 4 depicts an apparatus for removal of contaminants from the surface of the workpiece, according to a preferred embodiment of the present invention.

Precipitated mineral particulates, colloidal silica, silicates, other base-soluble contaminants and organic solvents are the most common contaminant on the surface 15 of the wafer 50 after completion of rinsing. Removal of this contaminant is necessary in order to manufacture a defect free wafer. Referring to FIG. 3, the chemically reactive additive 65 begins dissolving into liquid film 35, immediately upon extending the portion 55 of the workpiece into the chemically reactive additive 65, wherein the concentration of the chemically reactive additive 65 in the liquid film 35 decreases in the direction of the liquid bath. Thus the concentration of the chemically reactive additive 65 in the liquid film 35 exhibits a concentration gradient in the liquid film 35. Also, since dissolving the chemically reactive additive 65 in the liquid film 35 results in a surface tension lowering, compared to the surface tension of the liquid film 35 at the interface 45 between the liquid film 35 and the liquid bath 40, a surface tension gradient also develops, decreasing in the direction away from the liquid bath 40. Developing the surface tension gradient drives the liquid film in the direction of the liquid bath 40, resulting in removal of contaminants from the portion 55 of the wafer extending away from the liquid bath 40, as depicted in FIG. 4. The finished wafer is then completely removed from the liquid bath 40.

Formation of a concentration gradient and resulting surface tension gradient in said liquid film 35 depends on one or more of several features. The features include: 1) a solubility of the chemically reactive additive 65 in the liquid film 35, 2) a partial pressure of the chemically reactive additive 65, 3) a temperature gradient in the liquid film 35, increasing in the direction of the liquid bath 40 that results when chemically reactive additive 65 dissolves in liquid film 35, and 4) a rate that the portion 55 of the wafer extends away from the liquid bath 40. Control of these features enables formation of the concentration gradient and resulting surface tension gradient. The greatest possible surface tension gradient is desirable.

In the case of chemically reactive additives such as ammonia, hydrogen chloride, carbon dioxide, hydrogen fluoride, the concentration range of the chemically reactive additive 65 for forming a concentration gradient in liquid film 35 is from about 0.001 mole % to about 10 mole % in an inert gas, wherein the inert carrier gas includes but is not limited to helium, nitrogen, argon or combinations thereof Alternatively, the inert carrier gas includes any gas that is chemically unreactive when it mixes with the chemically reactive additive. Combinations of chemically reactive additives (e.g. NH3 and HCl) that form pH buffered solutions may be used. Also, chemically reactive additives such as hydrogen fluoride that volatilizes silica by forming silicon tetrafluoride may be used. Alternatively, vaporizing a chemically reactive additive that is naturally a liquid or a solid at a temperature and pressure chosen for operation of the apparatus, using heat, such as mono-, di-, or trichloroacetic acid, citric acid, sulfonic acids, mono-, di-, trifluoroacetic acid and combinations thereof, provides sufficient concentrations in the atmosphere surrounding the liquid film for concentration gradient formation. Instead of vaporizing the chemically reactive additive, spraying an aqueous solution of the chemically reactive additive wherein a liquid spray contacts a liquid film is an alternative technique to form a concentration gradient of a chemically reactive additive in a liquid film.

When the portion 35 of the liquid film becomes basic, as when the chemically reactive additive includes but is not limited to ammonia, contaminants such as mineral particulates, colloidal silica, silicates and other base solubles from the surface 15 of the wafer 50 are dissolved in the portion 35 of the liquid film. Instead of introducing ammonia gas into the portion 35 of the liquid film, an alternative is contacting the liquid film 35 using a liquid spray, wherein the liquid spray is an aqueous solution of ammonia and wherein the aqueous solution has a concentration of ammonia in water from about 0.001 mole % to about 10 mole %. Alternatively, contacting the liquid film 35 with a liquid spray, wherein the chemically reactive additive in the liquid spray includes but is not limited to one of the group of amino-functionalized surfactants, alkylbenzene sulfonates, olefinsulfonates, water soluble basic polymers, anionic surfactants and combinations thereof, provides sufficient concentration of chemically reactive additive in the atmosphere surrounding the liquid film for a concentration gradient to form. Specifically, a reaction that occurs between the portion 35 of the liquid film that is made basic by introducing the chemically reactive additive 65 and the group including residual mineral particulates, colloidal silica, silicates and other base soluble contaminants on the surface 15 of the wafer 50 is shown in the following example:

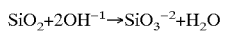
$$SiO_2 + 2OH^{-1} \rightarrow SiO_3^{-2} + H_2O$$

In addition, dissolving other metal oxides such as calcium oxide and transition metal oxides such as chromium oxide and iron oxide on the surface 15 of the wafer 50, are analogous alternatives to dissolving silica in the above example.

It should be appreciated, however, that a chemically reactive additive 65 that mixes with the liquid film 35 on the extended portion 55 of the wafer, depicted in FIG. 3, to yield an acidic solution can be employed depending on the purpose. For example, introduction of the chemically reactive additive 65 that includes, but is not limited to hydrogen chloride, carbon dioxide, hydrogen fluoride, mono-, di-, or trichloroacetic acid, citric acid, sulfonic acids, mono-, di-, or trifluoroacetic acid and combinations thereof to the portion 35 of the liquid film dissolves metal salt residues from wet chemical treatment of the wafer including but not limited to oxides of alkaline earth and transition metals such as calcium, chromium, zinc, iron, aluminum, cobalt, titanium and copper. Alternatively, use of a chemically reactive additive 65 wherein a portion of the chemically reactive additive is an acid in water and a remaining portion is a base in water offers the opportunity to buffer the pH of the liquid film 35 in FIG. 3 to control the equilibrium between soluble silicates ($SiO_3^{-2}$) and insoluble silica ($SiO_2$). In addition, use of a chemically reactive additive 65 wherein a portion of the chemically reactive additive is an acid in water and a remaining portion is a base in water offers the opportunity to buffer the pH of the liquid film 35 in FIG. 3 to remove contaminants by exposing the workpiece to the chemically reactive additive without pitting the workpiece. In addition, use of a chemically reactive additive 65 wherein a portion of the chemically reactive additive is an acid in water and a remaining portion is a base in water or wherein a first portion of the chemically reactive additive is an acid in water, a second portion is a base in water and a third portion is an inert gas, offers the opportunity to buffer the pH of the portion 35 of the liquid film in FIG. 3 to maintain a constant pH to effect contaminant removal by taking advantage of the relationship between the particle zeta potential and pH. Alternatively, dissolving a carboxylic acid chemically reactive additive such as mono-, di-, or trichloroacetic acid, citric acid, sulfonic acids, mono-, di-, or trifluoroacetic acid and combinations thereof, and mono-, di-, and tri-sodium phosphate in a thin film, also offers the opportunity to buffer the pH of the portion 35 of the liquid film in FIG. 3 to maintain a constant pH less than about 3+/−0.2 pH units.

FIG. 3 depicts, according to the present invention, a preferred embodiment for removing silica from the surface 15 of the wafer 50, wherein a fraction of the chemically reactive additive is ammonia and a remaining fraction is an inert gas, that is preferred because a basic solution is formed in portion 35 of the liquid film on the extended portion 55 of the wafer. When the liquid bath 40 is deionized water and the chemically reactive additive 65 is ammonia, the preferred concentration of ammonia is about 1 mole % or its equivalent in inert gas. If the concentration of the chemically reactive additive 65 is lower than said amount, a smaller concentration gradient and smaller surface tension gradient results, leading to a longer time to drive the liquid film 35, including contaminants into the liquid bath 40. Likewise, if the concentration is higher than about 1 mole % or its equivalent in inert gas, a smaller concentration gradient or surface tension gradient results as the liquid film 35 approaches saturation by the chemically reactive additive 65 throughout its cross-section.

Formation of the surface tension gradient of the chemically reactive additive 65 in liquid film 35 is also a function of a temperature differential between the liquid bath 40 and the liquid film 35, as depicted in FIG. 3. Dissolving the chemically reactive additive in the liquid film 35 raises its temperature due to an exothermic reaction between the chemically reactive additive 65 and the liquid film 35, creating a temperature differential or gradient in the liquid film that increases in the direction away from the liquid bath. In the preferred embodiment using hydrogen chloride gas as the chemically reactive additive, if the temperature of the liquid bath is about 0.1° C. to about 50° C., a temperature differential will enhance a surface tension gradient in the liquid film 35, as depicted in FIG. 3 that decreases in the direction away from the liquid bath 40, thus favoring removal of contaminants and the liquid film 35 into the liquid bath 40. In other embodiments, the largest surface tension gradient may be created using a liquid bath 40 temperature from about a freezing point of the liquid bath 40 to from about 18° C. to about 22° C., wherein the freezing point depends on a pressure chosen for operation of the apparatus and the freezing point depression of pure water due to colligative properties of the soluble materials in the liquid bath 40.

Referring to FIG. 3, rate of formation of the surface tension gradient is also determined by a rate at which the wafer is withdrawn from the liquid bath 40 or the rate at which liquid bath 40 is lowered away from the wafer, to extend a portion of the wafer 55 away from the liquid bath 40, also depicted in FIG. 3. If the rate exceeds 15 cm/sec, the chemically reactive additive 65 will have less time to dissolve in the liquid film 35 furthest from the liquid bath, so a smaller concentration gradient or surface tension gradient will result. The workpiece is withdrawn through a liquid at a rate of from about 0.00015 cm/sec to about 15 cm/sec.

Referring to FIG. 4, formation of the surface tension gradient drives liquid film 35 and contaminants from the surface 15 of the extended portion 55 of the wafer into liquid bath 40, leaving only an edge 59 of the extended portion 55 of the wafer in contact with liquid bath 40 at an interface 45. The chemically reactive additive can then be purged from the apparatus 25 and the wafer removed from the apparatus.

Figure 5:
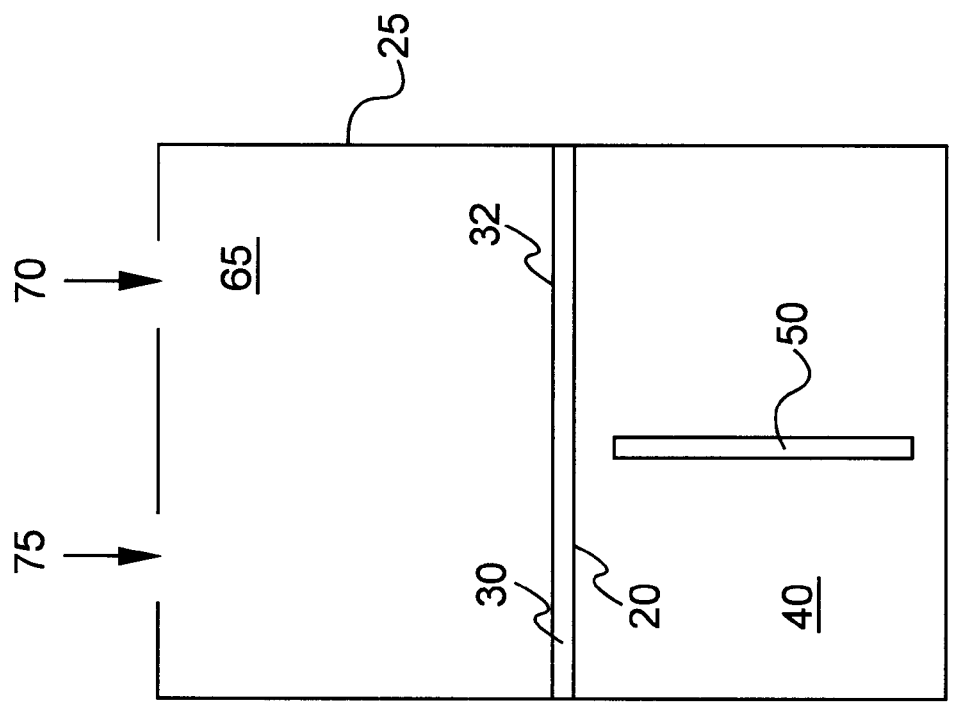
FIG. 5 depicts an apparatus for rinsing the workpiece with liquid and introducing a chemically reactive additive diffusion limiting barrier over a liquid, to protect the liquid from exposure to a chemically reactive additive, according to a preferred embodiment of the present invention.

In another embodiment of the present invention, FIG. 5 depicts introducing a chemically reactive additive diffusion limiting barrier over the liquid bath 40 and a chemically reactive additive 65 over the chemically reactive additive diffusion limiting barrier prior to withdrawing the wafer from the liquid bath 40. The purpose of the chemically reactive additive diffusion limiting barrier is prevention of chemically reactive additive 65 from dissolving into liquid bath 40.

Figure 6:
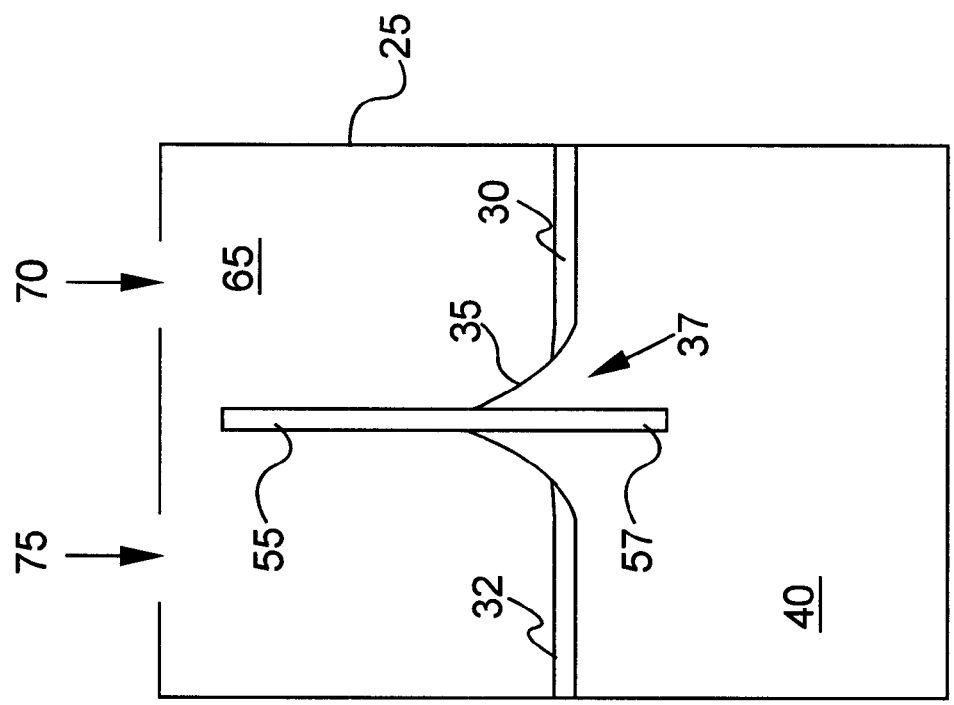
FIG. 6 depicts an apparatus in which a liquid bath is protected from exposure to a chemically reactive additive during formation of a surface tension gradient in the liquid film on the surface of the workpiece, according to a preferred embodiment of the present invention.

Referring to FIG. 6, removal of the contaminants from the wafer includes withdrawing the wafer, or alternatively lowering of the liquid bath 40, and chemically reactive additive diffusion limiting barrier 30 away from the wafer, resulting in extending a portion of the workpiece 55 through the surface 32 of the chemically reactive additive diffusion limiting barrier 30, wherein said portion 55 is covered with a liquid film 35 and wherein said liquid film is exposed to chemically reactive additive 65. Introducing the chemically reactive additive either as a static atmosphere or as a flow over the surface 32 of the chemically reactive additive diffusion limiting barrier 30 in FIG. 2 provides the chemically reactive additive 65 in apparatus 25. If ammonia is the chemically reactive additive 65, the preferred chemically reactive additive diffusion limiting barrier 30 is one of an organic solvent, a hydrocarbon oil or a fluorocarbon oil, although many alternatives exist. The chemically reactive additive diffusion limiting barrier includes liquids such as non-polar organic compounds that do not react with the wafer, are insoluble in water and in which ammonia is also insoluble, having a density less than the liquid bath 40 and a boiling point greater than about 60° C. at a pressure chosen for operation of the apparatus. Alternatively, the chemically reactive additive diffusion limiting barrier can also be an elastomer such as a fluorinated rubber that is not soluble in the liquid bath 40, resistant to corrosion by reactive gases such as ammonia, hydrogen chloride, carbon dioxide, hydrogen fluoride, carboxylic acids and combinations thereof, and will allow extending a portion 55 of the wafer through the chemically reactive additive diffusion limiting barrier 30, wherein said portion 55 is covered with a liquid film 35 wherein said liquid film 35 is exposed to chemically reactive additive 65.

Figure 7:
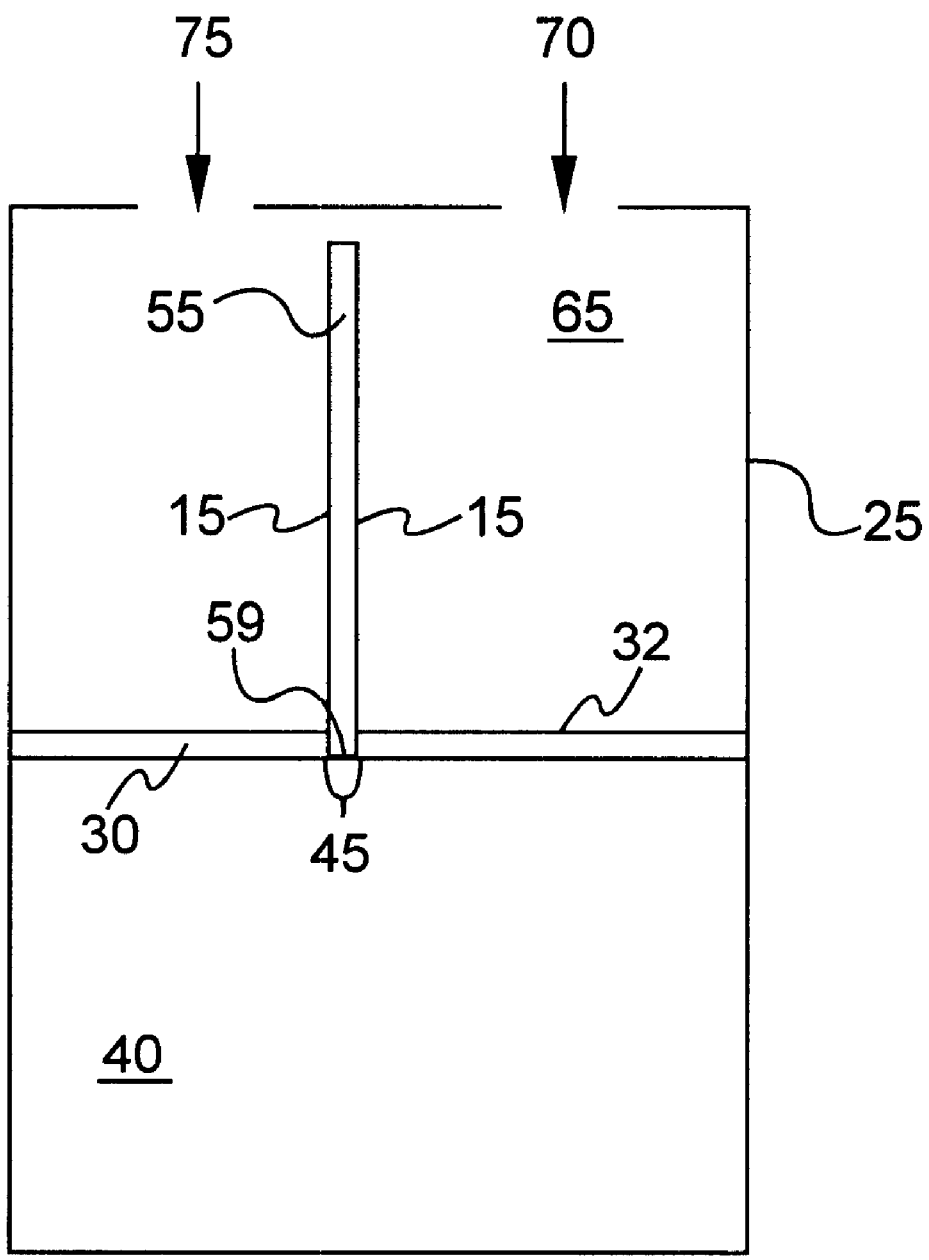
FIG. 7 depicts an apparatus for removal of contaminants from the surface of a workpiece, wherein a liquid bath is protected from exposure to a chemically reactive additive, according to a preferred embodiment of the present invention.

Referring to FIG. 7, formation of the surface tension gradient drives liquid film 35 and contaminants from the surface 15 of the extended portion 55 of the wafer, into the chemically reactive additive diffusion limiting barrier 30, and then into liquid bath 40, leaving only an edge 59 of the extended portion 55 of the wafer in contact with liquid bath 40 at an interface 45. The chemically reactive additive can then be purged from the apparatus 25 and the wafer removed from the apparatus.

Figure 8:
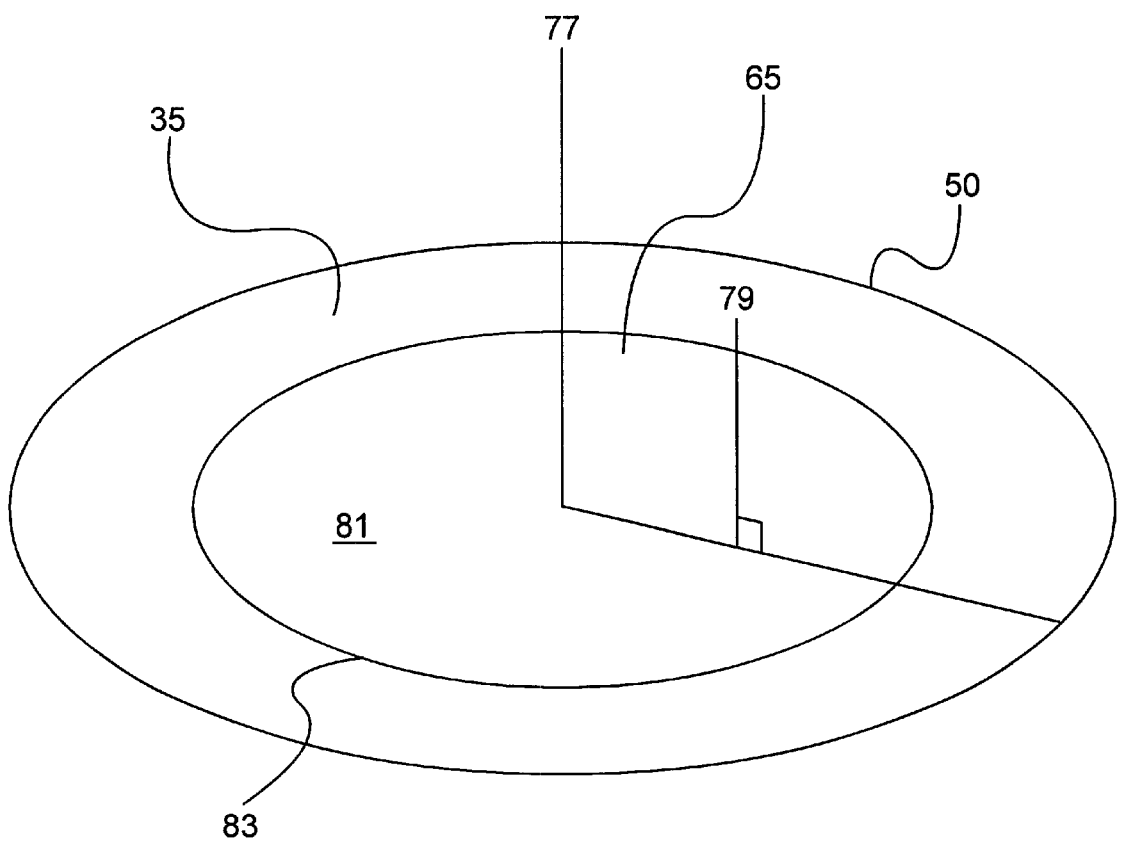
FIG. 8 depicts an apparatus for removal of contaminants from the surface of a workpiece, wherein a liquid film is removed from the surface of the workpiece by rotating the workpiece and exposing the liquid film to a chemically reactive additive, according to a preferred embodiment of the present invention.

Referring to FIG. 8, a liquid film 35 is applied as a spray or liquid puddle to the surface of a flat workpiece, 50, such as a silicon wafer. The wafer, 50, is rotated around a rotation axis that is through the center, 77, and normal to the surface of the workpiece or alternatively it may be rotated around a rotation axis that is off center, 79, and normal to the surface of the workpiece. The centripetal force that results from rotation of the wafer, 50, around the rotation axis removes a portion of liquid film 35 from the surface 81, of wafer 50. Chemically reactive gas 65 is introduced around the perimeter, 83, of a remaining portion of liquid film 35, such that a concentration gradient of the chemically reactive gas forms wherein the concentration gradient decreases in the direction away from the center, 77, of the wafer, 50. Formation of the surface tension gradient drives liquid film 35 and contaminants from the surface of the wafer. The chemically reactive additive can then be purged from the apparatus 25 and the wafer removed from the apparatus.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A method for removing contaminants from a workpiece, comprising the steps of:
   providing a workpiece;
   contacting the workpiece with a liquid, the liquid including water, wherein at least a portion of the liquid in contact with the workpiece includes contaminants;
   exposing the portion of the liquid in contact with the workpiece to an additive, wherein the additive changes the pH of the portion of the liquid to an effective pH that effects the removal of the contaminants from the workpiece; and
   removing the portion of the liquid containing the contaminants and the additive from said workpiece using a concentration gradient of said additive in the portion of the liquid.

2. The method of claim 1, wherein the workpiece includes silicon, and the effective pH controls the equilibrium between soluble silicates ($SiO_3^{-2}$) and insoluble silica ($SiO_2$) to prevent precipitation of insoluble silica ($SiO_2$) onto the workpiece.

3. The method of claim 2, wherein the additive includes a pH buffer to maintain the effective pH.

4. The method of claim 1, wherein the workpiece includes a silicon wafer and the portion of the liquid includes contaminants selected from the group consisting of colloidal silica, silicates and combinations thereof.

5. The method of claim 4, wherein a first fraction of the additive is ammonia.

6. The method of claim 5, wherein the first fraction of the additive combines with the portion of the liquid to form a basic solution that prevents the precipitation of insoluble silica (SiO2) onto the workpiece while the portion of the liquid containing the contaminants is being removed.

7. The method of claim 6, wherein the additive includes a pH buffer to maintain the effective pH in the portion of the liquid containing the contaminants.

8. The method of claim 7, wherein a second fraction of the additive is an acid in water and combines with the first fraction to form a pH buffered solution in the portion of the liquid containing the contaminants.

9. A method for removing contaminants from a workpiece, comprising the steps of:
   providing a workpiece;
   contacting the workpiece with a liquid, the liquid containing water and contaminant particles;
   withdrawing said workpiece from said liquid, such that a portion of said workpiece is submerged in the liquid, and a liquid film on a remaining portion of said workpiece is exposed to an additive, wherein the additive changes the pH of the liquid film to an effective pH that effects the removal of the contaminant particles from the workpiece, wherein the effective pH is less than about 3.2 pH units;
   developing a concentration gradient of said additive in said liquid film; and removing the liquid film from said workpiece using said concentration gradient of said additive in said liquid film.

10. The method of claim 9, wherein the removal of the contaminant particles from the workpiece includes preventing precipitation of the contaminant particles onto the workpiece by employing the inherent relationship between pH and zeta potential of the contaminant particles.

11. The method of claim 10, wherein the contaminant particles are selected from the group consisting of mineral particulates, soluble and insoluble metal oxides and metal hydroxides, colloidal silica, silicates, and combinations thereof.

12. The method of claim 11, wherein at least a portion of the contaminant particles are chemically dissolved by exposing the liquid film on the remaining portion of the workpiece to the additive.

13. The method of claim 9, wherein the additive includes a pH buffer system to maintain the effective pH.

14. The method of claim 9, wherein the concentration of the additive in the liquid film is from about 0.001 mole % to about 10 mole %.

15. The method of claim 9, wherein the additive is selected from the group consisting of combinations of ammonia, hydrogen chloride, carbon dioxide, hydrogen fluoride, mono-, di-, or trifluoroacetic acid, mono-, di-, trichloroacetic acid, citric acid, sulfonic acids.

16. The method of claim 9, wherein completing the step of withdrawing the workpiece through said liquid is at a rate of from about 0.00015 cm/sec to about 15 cm/sec.

17. The method of claim 9, wherein the additive is selected from the group consisting of hydrogen chloride, hydrogen fluoride, mono-, di-, or trifluoroacetic acid, mono-, di-, trichloroacetic acid, citric acid, sulfonic acids, and combinations thereof.

18. The method of claim 17, wherein the additive further comprises one selection of a group of mono-, di-, and tri-sodium phosphate and wherein the liquid film has a buffered pH less than about 3.2 pH units.

19. The method of claim 9, wherein the additive includes a gas that will exothermically react with the liquid film and create a temperature gradient in the liquid film that favors removal of the contaminant particles and the liquid film.

20. The method of claim 9, wherein the step of removing the liquid film from the workpiece further comprises including an inert gas as an inert fraction of the additive.

21. The method of claim 20, wherein the inert gas is selected from the group consisting of nitrogen, helium, argon and combinations thereof.

22. A method for removing contaminants from a workpiece, comprising the steps of:
   providing a liquid bath;
   providing a workpiece submerged in said liquid bath;
   providing an additive diffusion limiting barrier over said liquid bath and an additive over said additive diffusion limiting barrier;
   extending a portion of the workpiece over said surface of the diffusion limiting barrier, wherein said portion is covered with a liquid film and wherein said liquid film includes some of said additive;
   developing a concentration gradient of said additive in said liquid film; and
   removing the liquid film from said workpiece using said concentration gradient of said additive in said liquid film.

23. The method of claim 22, wherein the liquid film has a pH less than about 3.2 pH units.

24. The method of claim 23, wherein the additive includes a carboxylic acid.

25. The method of claim 24, wherein the carboxylic acid is selected from the group consisting of mono-, di-, or trichloroacetic acid, citric acid, sulfonic acids, mono-, di-, or trifluoroacetic acid and combinations thereof.

26. The method of claim 24, wherein the additive includes a carboxylic acid that gives the liquid film a pH less than about 3.2 pH units.

* * * * *